United States Patent
Komai

(10) Patent No.: US 8,238,156 B2
(45) Date of Patent: Aug. 7, 2012

(54) NONVOLATILE SEMICONDUCTOR MEMORY DEVICE AND METHOD OF OPERATING THE SAME

(75) Inventor: Hiromitsu Komai, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 330 days.

(21) Appl. No.: 12/721,212

(22) Filed: Mar. 10, 2010

(65) Prior Publication Data
US 2010/0238723 A1    Sep. 23, 2010

(30) Foreign Application Priority Data
Mar. 17, 2009    (JP) ................. 2009-063883

(51) Int. Cl.
*G11C 11/34* (2006.01)
(52) U.S. Cl. ......... 365/185.03; 365/185.12; 365/185.24; 365/185.21
(58) Field of Classification Search ............. 365/185.03, 365/185.12, 185.24, 185.21, 189.05, 189.06
See application file for complete search history.

(56) References Cited

U.S. PATENT DOCUMENTS

| | | | |
|---|---|---|---|
| 6,643,188 B2 | 11/2003 | Tanaka et al. | |
| 6,990,019 B2 | 1/2006 | Tanaka et al. | |
| 7,088,616 B2 | 8/2006 | Tanaka et al. | |
| 7,224,615 B2 | 5/2007 | Tanaka | |
| 7,286,404 B2 | 10/2007 | Tanaka et al. | |
| 7,301,806 B2 | 11/2007 | Tanaka | |
| 7,405,970 B2 | 7/2008 | Tanaka et al. | |
| 7,468,908 B2 | 12/2008 | Tanaka | |
| 7,492,641 B2 | 2/2009 | Hosono et al. | |
| 7,957,185 B2 * | 6/2011 | Li et al. ................. | 365/185.03 |

FOREIGN PATENT DOCUMENTS

| | | |
|---|---|---|
| JP | 2003-196988 | 7/2003 |
| JP | 2005-174414 | 6/2005 |
| JP | 2007-4861 | 1/2007 |

* cited by examiner

*Primary Examiner* — David Lam
(74) *Attorney, Agent, or Firm* — Oblon, Spivak, McClelland, Maier & Neustadt, L.L.P.

(57) ABSTRACT

A nonvolatile semiconductor memory device comprises: a memory cell array having a plurality of memory cells arranged therein, each of the memory cells capable of storing multiple bits of information including multiple pages of information and is allocated to a plurality of threshold voltage distributions; and a control circuit configured to write information to a memory cell by applying a voltage to a bit line and a word line to change a threshold voltage of the memory cell. During writing of information to a plurality of the memory cells connected to an identical word line, the control circuit is configured to apply, to each of the bit lines corresponding to the plurality of the memory cells, any one of voltages that differ from one another according to the multiple bits of information to be written.

20 Claims, 11 Drawing Sheets

FIG. 13

(a)
UDL  1 0 0 1
LDL  1 1 0 0
SA
Threshold  Er A B C

Upper data in UDL
Lower data in LDL (b) SA ⇐ UDL & LDL
UDL  1 0 0 1
LDL  1 1 0 0
SA   1 0 0 0
Threshold  Er A B C COM set to VDD for Er cell only (c) SA ⇐ (~UDL & LDL) | SA
UDL  1 0 0 1
LDL  1 1 0 0
SA   1 1 0 0
Threshold  Er A B C COM set to VDD for Er and A; set to 0V for B and C (d) SA ⇐ (~UDL | LDL) | SA
UDL  1 0 0 1
LDL  1 1 0 0
SA   1 1 1 0
Threshold  Er A B C COM set to VDD for Er, A, and B; set to 0V for C

NONVOLATILE SEMICONDUCTOR MEMORY DEVICE AND METHOD OF OPERATING THE SAME

CROSS REFERENCE TO RELATED APPLICATIONS

This application is based upon and claims the benefit of priority from prior Japanese Patent Application No. 2009-63883, filed on Mar. 17, 2009, the entire contents of which are incorporated herein by reference.

BACKGROUND OF THE INVENTION

1. Field of the Invention

The present invention relates to a nonvolatile semiconductor memory device, in particular, to a nonvolatile semiconductor memory device capable of storing multiple bits in one memory cell, and to a method of operating the same.

2. Description of the Related Art

NAND flash memory is known as one of nonvolatile semiconductor memory devices. This NAND flash memory has a memory cell array including a plurality of NAND cell units. Each NAND cell unit is configured by a plurality of memory cells connected in series and two select transistors connected to both ends thereof.

Each memory cell stores, in an erase state, data "1" having a negative threshold voltage. In a data write operation, electrons are injected into a floating gate to write data "0" having a positive threshold voltage. The NAND flash memory may change the threshold voltage only from a lower value to a higher value in a data write operation, and may change the threshold voltage in the reverse direction (from a higher value to a lower value) only by an erase operation on a block basis.

To increase memory capacity, current technology has developed so-called multi-value NAND flash memory to store two or more bits of information in one memory cell. For example, when 2 bits are stored in one memory cell, one memory cell has $2^2=4$ different threshold voltage distributions. A write operation in the case of storing 4 values (2 bits) of information in one memory cell in the NAND flash memory is performed as follows. First, subsequent to applying a write voltage Vpgm having an initial value Vpgmi (for example, about 15 V) to a control gate of the memory cell subject to the write operation, a verify judgment is performed. If, as a result of the verify judgment, the write operation is judged to be incomplete, the write voltage Vpgm is stepped up in increments of 0.1 V-1 V, and the write operation is re-performed using this stepped-up write voltage Vpgm. By repeating the verify judgment and the write operation at the stepped up write voltage in such a way, the write operation is performed sequentially from a low threshold voltage distribution (Japanese Unexamined Patent Application Publication No. 2007-004861).

This kind of multi-value storage NAND flash memory has the problem that the number of applications (number of step-ups) of the write voltage Vpgm applied to the control gate of the memory cell differs according to the data to be stored, resulting in a lengthening of write time. Consider, for example, the case of attempting to assign four different threshold voltage distributions Er, A, B, and C (Er<A<B<C) to one memory cell. In this case, if the applied voltage is the same, the number of applications of the write voltage Vpgm required to change from distribution Er to distribution C is greater than that required to change from distribution Er to distribution A. Consequently, in the case that each of the threshold voltage distributions Er, A, B, and C are assigned to a plurality of memory cells along a single word line, the write operation for memory cells where distribution A is to be written is completed in a small number of applications, while the write operation for memory cells where distribution C is to be written requires a greater number of applications. If, to reduce the number of applications, the initial value Vpgmi of the write voltage Vpgm is increased or a step-up width is increased, there is a risk that an erroneous write occurs in the memory cells where the low threshold voltage distribution A is to be written. The initial value and step-up width must therefore be set in line with the case where data of the low threshold voltage distribution is written, and this results in a lengthening of the write time.

SUMMARY OF THE INVENTION

In accordance with a first aspect of the present invention, a nonvolatile semiconductor memory device comprises: a memory cell array having a plurality of memory cells arranged therein, each of the memory cells capable of storing multiple bits of information including multiple pages of information and is allocated to a plurality of threshold voltage distributions; and a control circuit configured to write information to a memory cell by applying a voltage to a bit line and a word line to change a threshold voltage of the memory cell, during writing of information to a plurality of the memory cells connected to an identical word line, the control circuit being configured to apply, to each of the bit lines corresponding to the plurality of the memory cells, any one of voltages that differ from one another according to the multiple bits of information to be written.

In accordance with a second aspect of the present invention, a nonvolatile semiconductor memory device comprises: a memory cell array having a plurality of memory cells arranged therein, each of the memory cells capable of storing multiple bits of information including multiple pages of information and is allocated to a plurality of threshold voltage distributions; and a control circuit configured to write information to a memory cell by applying a voltage to a bit line and a word line to change a threshold voltage of the memory cell, the control circuit comprising: a data latch circuit configured to retain data of one page out of the multiple pages as information to be written to the memory cells; an arithmetic circuit configured to perform a logical operation on the multiple pages of information retained in the data latch circuit; a sense amplifier circuit configured to control a voltage of a first node based on an operation result of the arithmetic circuit; and a bit-line-clamp-transistor having one end connected to the bit line and another end connected to the first node and configured to clamp a voltage of the bit line when a clamp voltage is applied to a gate thereof, during writing of information to a plurality of the memory cells connected to an identical word line, the control circuit being configured to apply a voltage to the first node using the sense amplifier circuit and change a value of the clamp voltage, thereby apply, to each of the bit lines corresponding to the plurality of the memory cells, any one of voltages that differ from one another according to the multiple bits of information to be written.

In accordance with a third aspect of the present invention, a method of operating a nonvolatile semiconductor memory device, the nonvolatile semi conductor memory device including a memory cell array having a plurality of memory cells arranged therein, each of the memory cells capable of storing multiple bits of information including multiple pages of information and is allocated to a plurality of threshold voltage distributions, and a control circuit configured to write information to a memory cell by applying a voltage to a bit line and a word line to change a threshold voltage of the memory cell, comprises: during writing of information to a plurality of the memory cells connected to an identical word line, applying, to each of the bit lines corresponding to the plurality of the memory cells, any one of voltages that differ from one another according to the multiple bits of information to be written; and applying a write voltage to the word line multiple times to write information to the memory cells.

BRIEF DESCRIPTION OF THE DRAWINGS

FIG. 13 is a view showing a logical operation in an arithmetic circuit and data retained in a data latch circuit in the nonvolatile semiconductor memory device in accordance with the second embodiment.

DETAILED DESCRIPTION OF THE EMBODIMENTS

Next, embodiments of the present invention are described in detail with reference to the drawings.

First Embodiment

First, a nonvolatile semiconductor memory device in accordance with a first embodiment of the present invention is described with reference to FIG. 1 and so on.

[Overall Configuration of System]

Figure 1:
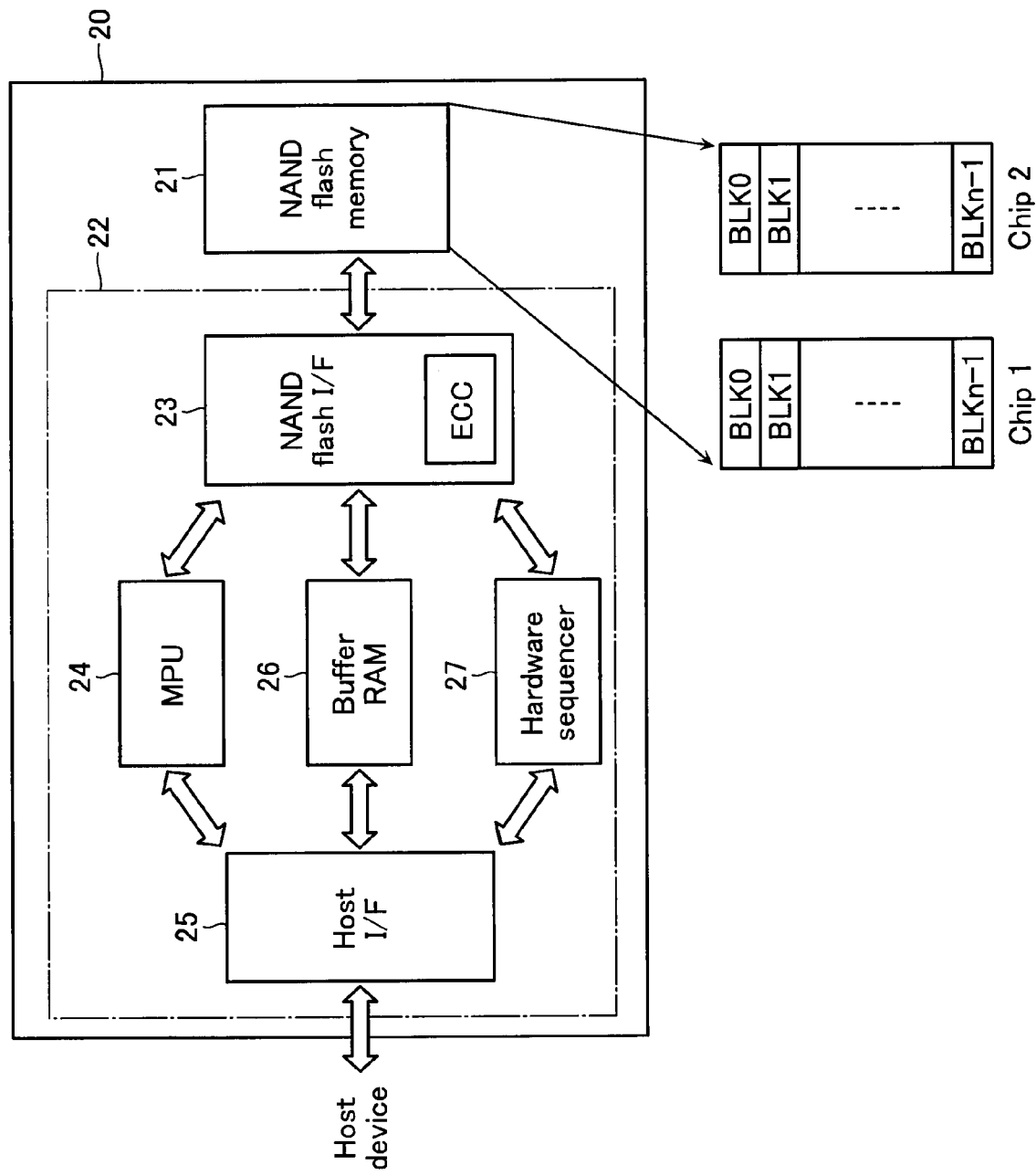
FIG. 1 is a block diagram showing an overall configuration of a nonvolatile semiconductor memory device in accordance with a first embodiment.

FIG. 1 is a block diagram showing an overall configuration of a memory card 20, which represents the nonvolatile semiconductor memory device in accordance with the first embodiment. The memory card 20 configures modules with a NAND flash memory 21 and a memory controller 22 that controls read/write operations of the NAND flash memory 21. The NAND flash memory chip 21 may be a plurality of memory chips. Although FIG. 1 shows two memory chips, i.e., chip 1 and chip 2, they are also controlled by the single memory controller 22. The memory controller 22 is a one-chip controller that includes a NAND flash interface 23 for transferring data to and from the NAND flash memory 21, an MPU 24 for controlling, not only data transfer, but also entire operations in the memory card, a host interface 25 for transferring data to and from a host device, a buffer RAM 26 for temporarily retaining read/write data, etc., and a hardware sequencer 27 for use in, e.g., sequence control of read/write of firmware (FW) within the NAND flash memory 21.

When the memory card 20 is powered on, an initializing operation (power-on initial setup operation) is performed to automatically read firmware (control program) stored in the NAND flash memory 21. The firmware (control program) is transferred to the data register (buffer RAM) 26. This read control operation is performed by the hardware sequencer 27. Using the firmware loaded on the buffer RAM 26, the MPU 24 creates tables on the buffer RAM 26, accesses the NAND flash memory 21 in response to commands from the host device, controls data transfer, and so on. In addition, the NAND flash interface 23 comprises an ECC circuit for performing error correction on read data, based on redundant data that is stored in the NAND flash memory 21.

Figure 2:
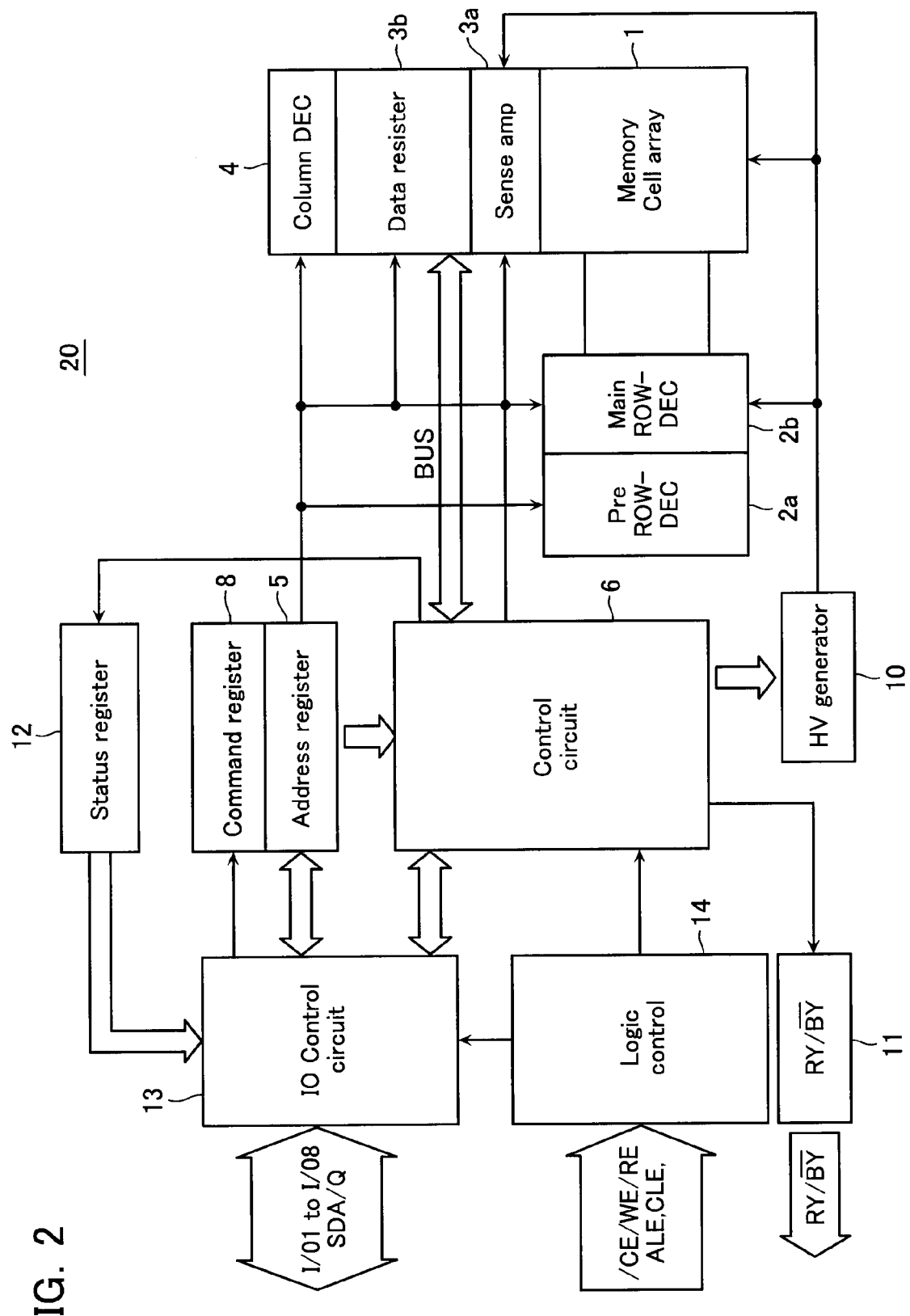
FIG. 2 is a functional block diagram where a logic control is described in an integrated manner for a memory chip and a controller of the nonvolatile semiconductor memory device in accordance with the first embodiment.

Note that it is not essential for the present memory system that the NAND flash memory 21 and the controller chip 22 be separate chips. FIG. 2 shows a configuration of functional blocks where a logic control is described in an integrated manner for the NAND flash memory 21 and the controller 22 of the memory card 20 of FIG. 1. In addition, FIG. 3 shows a configuration of a cell array in a memory core portion.

Figure 3:
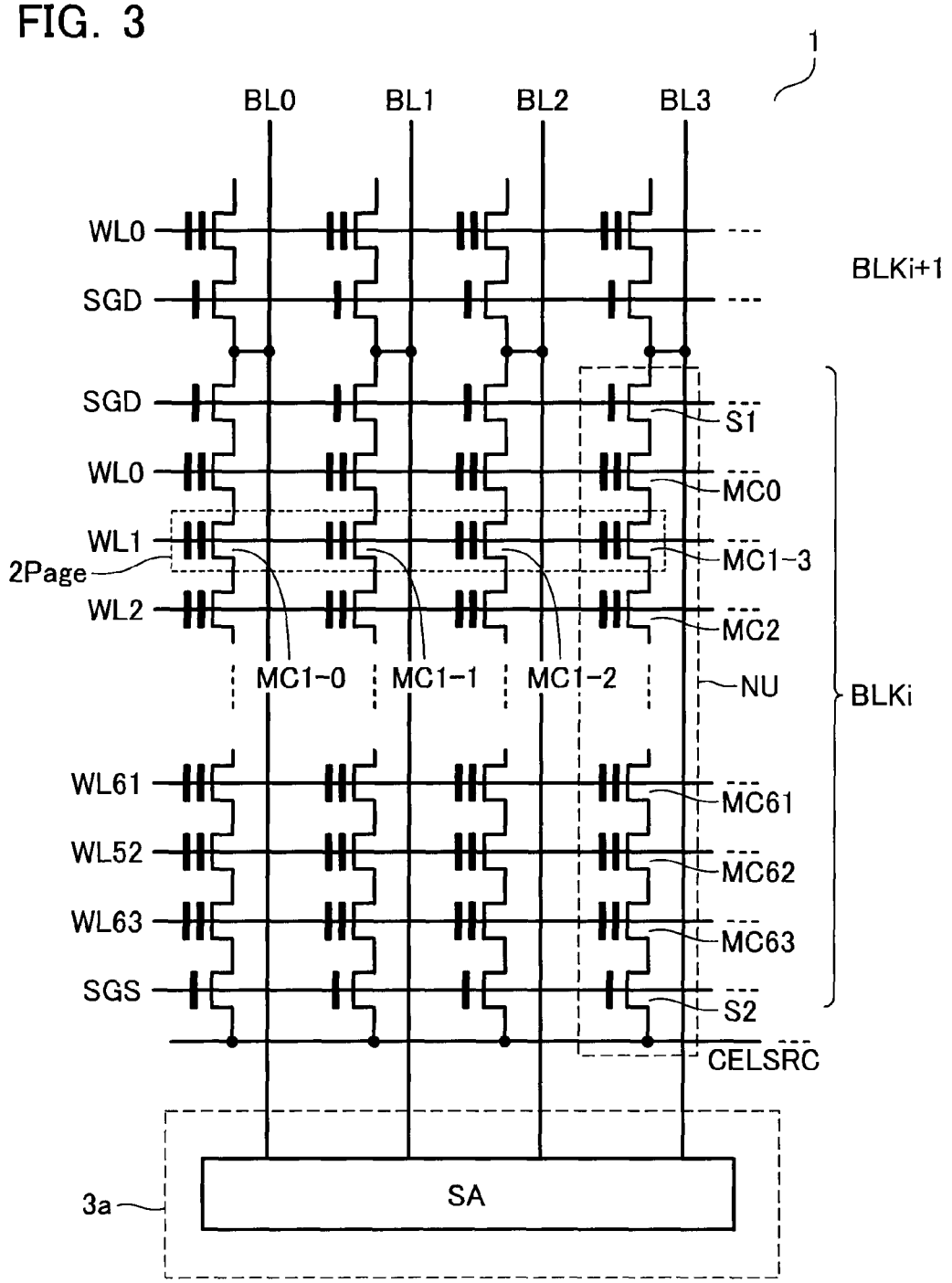
FIG. 3 is a circuit diagram showing a specific configuration of a memory cell array in the nonvolatile semiconductor memory device in accordance with the first embodiment.

As shown in FIG. 3, a memory cell array 1 includes NAND cell units (NAND strings) NU arranged therein, each of which has a plurality of electrically rewritable nonvolatile memory cells (in FIG. 3, 64 memory cells) MC0-MC63 connected in series. A plurality of NAND cell units NU together form one block BLK, sharing corresponding word lines WL. One block BLK forms one unit for a data erase operation. In addition, when 2 bits of data are stored in one memory cell MC (2 bits per cell), two pages (upper page, lower page) of data are stored by those memory cells MC that are formed along one word line WL. The number of word lines WL included in one block BLK in one memory cell array 1 is 64, and the number of pages included in one block is 64×2=128. Note that, to simplify description, it is assumed in this embodiment that the number of memory cells MC that are formed along one word line WL is 4, whereby 2×4=8 bits of data are stored in one page. However, the present invention is of course not limited to such a configuration.

As shown in FIG. 3, one end of each of the NAND cell units NU is connected via a select gate transistor S1 to respective bit lines BL0-BL3, and the other end connected via a select gate transistor S2 to a common source line CELSRC. The gates of the select gate transistors S1 and S2 are connected to respective select gate lines SGD and SGS. In addition, the control gates of the memory cells MC0-MC63 are connected to respective word lines WL0-WL63. A sense amplifier circuit 3a, which is utilized to read and write cell data, is positioned at one end of each of the bit lines BL. A row decoder 2

(not shown in FIG. 3), which selectively drives each word line and select gate line, is positioned at one end of each of the word lines WL.

As shown in FIG. 2, commands, addresses and data are inputted via an I/O control circuit 13. In addition, chip-enable signals /CE, write-enable signals /WE, read-enable signals /RE, and other external control signals are input to a logic circuit 14 for timing control. Commands are decoded at a command register 8. A control circuit 6 controls data transfer and performs write/erase/read sequence control. A status register 11 outputs Ready/Busy states of the memory card 20 to a Ready/Busy terminal. In addition to this, a status register 12 is also provided that informs the host of the states of the memory 20 (Pass/Fail, Ready/Busy, and so on) via an I/O port.

Addresses are transferred via an address register 5 to the row decoder 2 (including a pre row decoder 2a and a main row decoder 2b) or a column decoder 4. Write data is loaded on a read/write control circuit 3 (including the sense amplifier circuit 3a and a data register 3b) via the I/O control circuit 13, the control circuit 6, and a data bus BUS. Read data is outputted via the control circuit 6 to the outside. A write operation using the control circuit 6 and read/write control circuit 3 is described in detail later.

A high-voltage generating circuit 10 is provided for generating a high voltage required for each mode of operation. The high-voltage generating circuit 10 generates a certain high voltage based on instructions from the control circuit 6.

Figure 4:
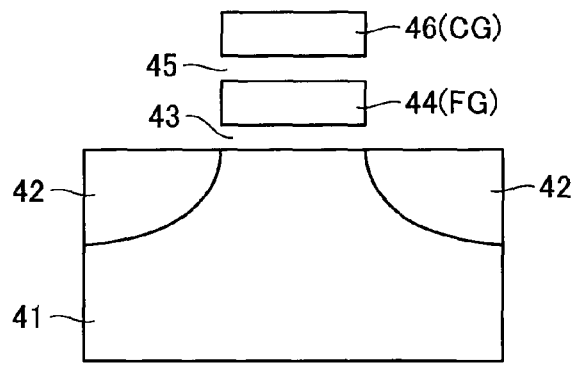
FIG. 4 is a cross-sectional view showing a configuration of a memory cell in the nonvolatile semiconductor memory device in accordance with the first embodiment.
Figure 5:
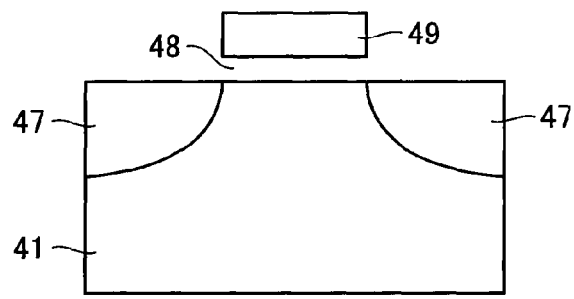
FIG. 5 is a cross-sectional view showing a configuration of a select transistor in the nonvolatile semiconductor memory device in accordance with the first embodiment.

FIGS. 4 and 5 show cross-sectional structures of one memory cell MC as well as select gates S1 and S2, respectively. N-type diffusion layers 42 are formed on a substrate 41 that function as the source and drain of a MOSFET configuring the memory cell MC. In addition, a floating gate (FG) 44 is formed on the substrate 41 via a gate insulating film 43. A control gate (CG) 46 is formed on the floating gate 44 via an insulating film 45.

Each of the select gates S1 and S2 comprises the substrate 41 and n-type diffusion layers 47 formed on the substrate 41 as its source and drain. A control gate 49 is formed on the substrate 41 via a gate insulating film 48.

Figure 6:
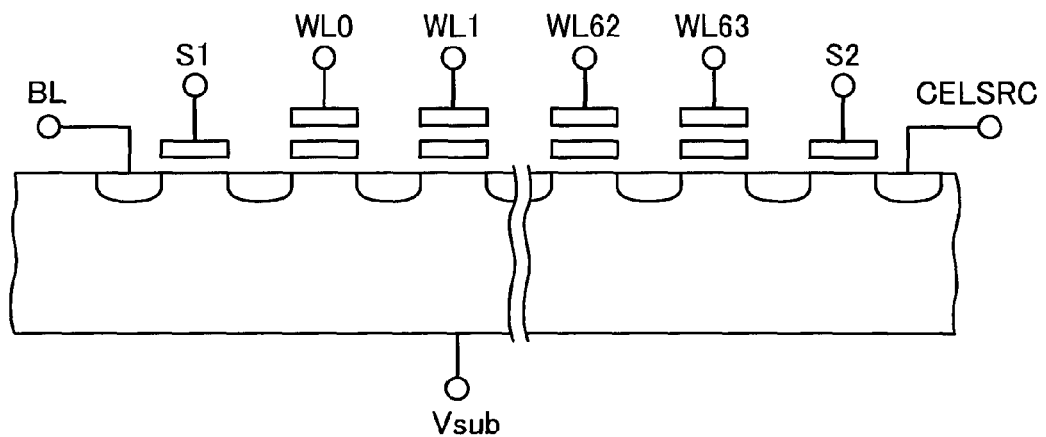
FIG. 6 is a cross-sectional view showing a configuration of a NAND cell unit in the nonvolatile semiconductor memory device in accordance with the first embodiment.

FIG. 6 shows a cross section of one NAND cell unit NU of the memory cell array 1. In this example, one NAND cell unit NU includes 64 memory cells MC configured as shown in FIG. 4, which memory cells are connected in series. Provided at the drain and source sides of the NAND cell unit NU are a first select gate S1 and a second select gate S2 configured as shown in FIG. 5.

[Multi-Value Storage Operation in NAND Flash Memory]

Next, a multi-value storage operation is described that is performed in the NAND flash memory configured in accordance with the present embodiment. In the NAND flash memory of the present embodiment, the value of threshold voltage may be controlled in four different ways for one memory cell to cause 2 bits of data to be stored in one memory cell.

Figure 7:
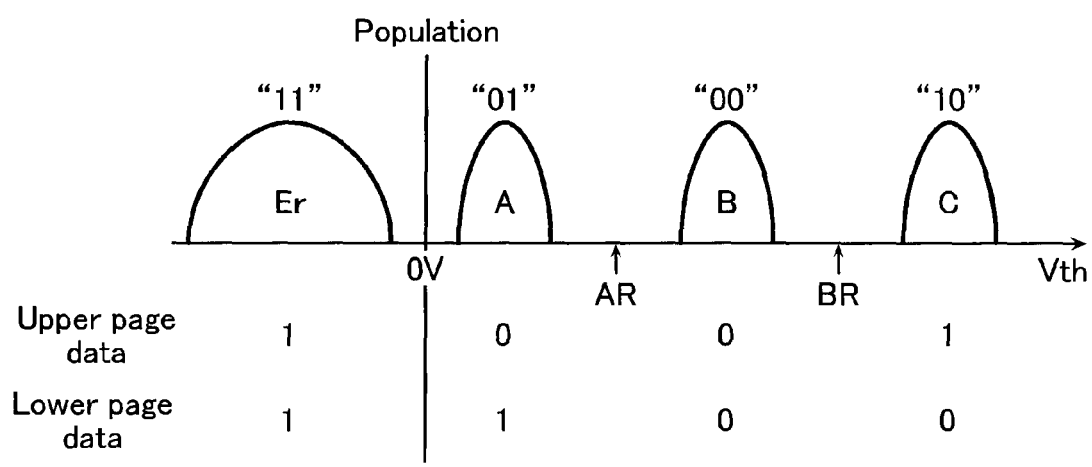
FIG. 7 is a view showing states of threshold voltage distributions where 2 bits of information are stored in one memory cell.

FIG. 7 shows the states of threshold voltage distributions (the relation between a threshold voltage and the number of cells) where 2 bits of information are stored in one memory cell. To store 2 bits of information, four different threshold voltage distributions (Er, and A-C) are provided corresponding to four different kinds of data, "11", "01", "00", and "10", for writing and reading information. That is, any one of four different kinds of bit information (11, and 01-10) is allocated to each of the four different threshold voltage distributions (Er, and A-C), respectively. Two sub-pages are formed corresponding to the 2 bits of data, namely, Upper page and Lower page.

The operation for reading these four different kinds of data is performed by applying a read voltage to a selected word line WL connected to the memory cell MC to detect whether the memory cell MC is conductive or not conductive. Corresponding to the four different threshold voltage distributions of the memory cell, the voltage values of read voltage applied to the selected word line WL may be set to voltages 0 V, AR, and BR (three different voltages) between each of the threshold voltage distributions. The lowest read voltage is 0 V, and the voltage value increases in order of: AR and BR. Note that the voltage to be applied to an unselected memory cell MC in a read operation is set to be greater than that for the threshold voltage distribution C to which data "10" is allocated.

Figure 8:
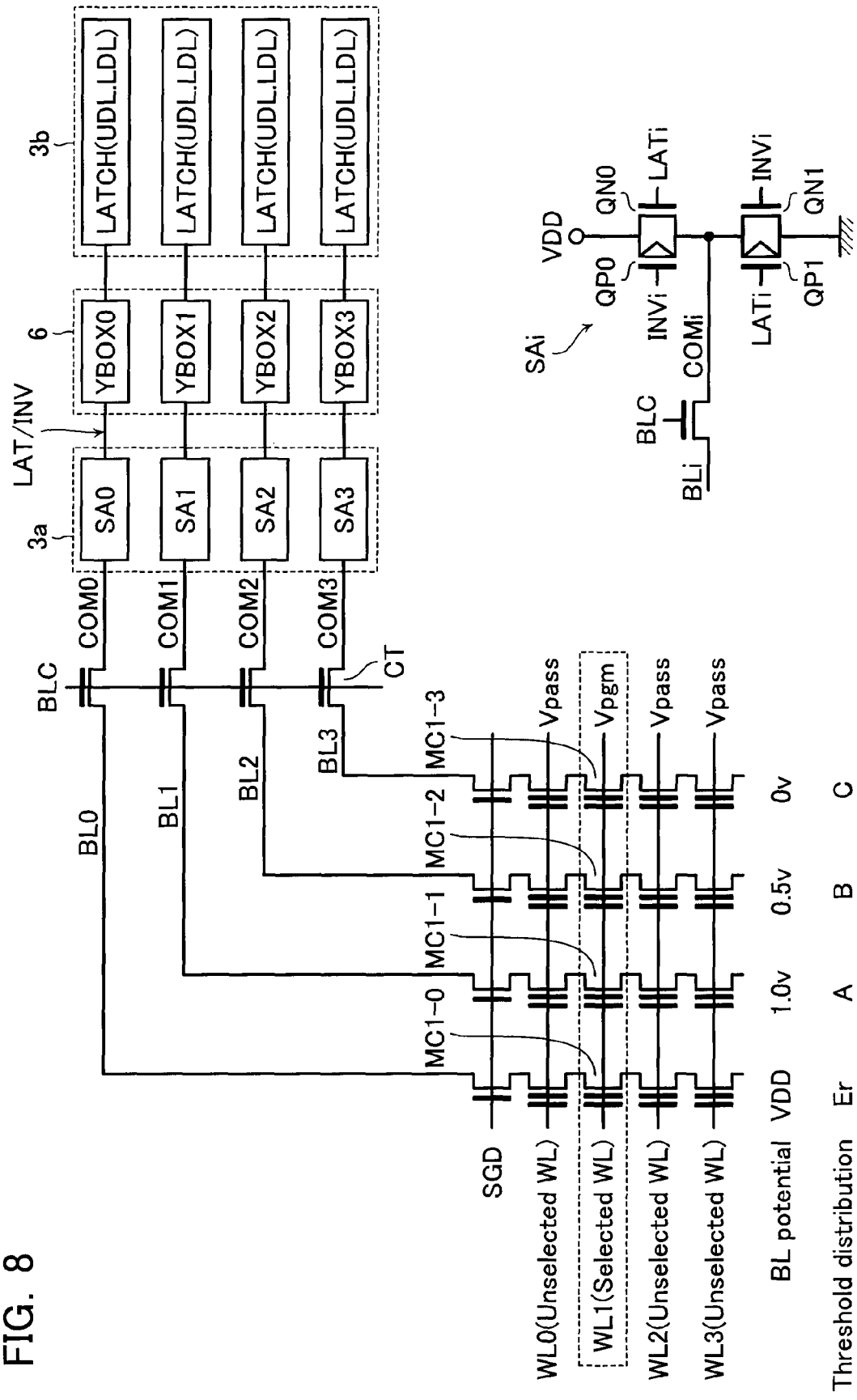
FIG. 8 is a block diagram showing a configuration of a sense amplifier circuit, an arithmetic circuit, and a data latch circuit in the nonvolatile semiconductor memory device in accordance with the first embodiment.

FIG. 8 is a block diagram showing a configuration of a sense amplifier circuit, an arithmetic circuit, and a data latch circuit used in a write operation in the nonvolatile semiconductor memory device in accordance with the present embodiment.

[Configuration]

The sense amplifier circuit 3a in the nonvolatile semiconductor memory device in accordance with the present embodiment includes a plurality of sense amplifiers SA0-SA3. The sense amplifiers SA0-SA3 are respectively connected to bit lines BL0-BL3, via bit-line-clamp-transistors CT. The sense amplifiers SA0-SA3 are respectively connected to arithmetic circuits YBOX0-YBOX3 in the control circuit 6. The arithmetic circuits YBOX0-YBOX3 execute arithmetic processing based on data retained in data latch circuits LATCH in the data register 3b, and output output-signals LAT/INV corresponding to an operation result of this arithmetic processing to the sense amplifiers SA0-SA3. The sense amplifiers SA0-SA3 control a voltage of nodes COM0-COM3 connected to the bit-line-clamp-transistors CT, based on the output-signals LAT/INV of the arithmetic circuits YBOX0-YBOX3. A bit-line-clamp-voltage-line BLC is commonly connected to gates of the bit-line-clamp-transistors CT. The bit-line-clamp-transistors CT transfer to the bit lines BL0-BL3 a voltage determined on the basis of voltages of the bit-line-clamp-voltage-line BLC and the nodes COM. Each of the data latch circuits LATCH includes an upper data latch UDL configured to retain upper page data, and a lower data latch LDL configured to retain lower page data.

An example of a configuration of a sense amplifier SAi (i=0-3) is shown here lower right of FIG. 8. The sense amplifier SAi includes an NMOS transistor QN0 having its drain connected to a power supply voltage VDD and its source connected to node COMi, and a PMOS transistor QP0 having its source connected to the power supply voltage VDD and its drain connected to the node COMi. The gate of the NMOS transistor QN0 is inputted with the output-signal LATi from the arithmetic circuit YBOXi, and the gate of the PMOS transistor QP0 is inputted with the output-signal INVi from the arithmetic circuit YBOXi. Here, the signal INVi is an inverted signal of the signal LATi. In addition, the sense amplifier SAi includes an NMOS transistor QN1 having its drain connected to the node COMi and its source grounded, and a PMOS transistor QP1 having its source connected to the node COMi and its drain grounded. The gate of the NMOS transistor QN1 is inputted with the output-signal INVi from the arithmetic circuit YBOXi, and the gate of the PMOS transistor QP1 is inputted with the output-signal LATi from the arithmetic circuit YBOXi.

When the signal LATi is "H" and the signal INVi is "L", the sense amplifier SAi renders the NMOS transistor QN0 and the PMOS transistor QP0 conductive, thereby setting the voltage of the node COMi to VDD. On the other hand, when the signal LATi is "L" and the signal INVi is "H", the sense amplifier SAi renders the NMOS transistor QN1 and the PMOS transistor QP1 conductive, thereby setting the voltage of the node COMi to a ground voltage VSS.

[Operation]

Next, a multi-value data write operation is described that is performed in the nonvolatile semiconductor memory device of the present embodiment thus configured. Description proceeds here assuming data write to be performed on four memory cells MC1-0 through MC1-3 (refer to FIG. 3). It is assumed that the memory cell MC1-0, the memory cell MC1-1, the memory cell MC1-2, and the memory cell MC1-3 connected to the word line WL1 are to be respectively written with data of a threshold voltage distribution Er (data "11"), a threshold voltage distribution A (data "01"), a threshold voltage distribution B (data "00"), and a threshold voltage distribution C (data "10").

The word line WL1, which is commonly connected to the memory cells MC1-0 through MC1-3 subject to execution of the write operation, is applied with a program voltage Vpgm (for example, about 20 V). The word lines WL0, WL2, WL3, and the word lines WL4-WL63 not shown in FIG. 8 are applied with a voltage Vpass (for example, about 8 V) such that a write to the memory cells MC does not occur.

During execution of the write operation, write data is inputted to the data latch circuits LATCH. The arithmetic circuits YBOX0-YBOX3 output the signal LAT and signal INV to the sense amplifiers SA0-SA3 based on the data in the data latch circuits LATCH. The sense amplifiers SA0-SA3 set the voltage of the nodes COM0-COM3 to the power supply voltage VDD or the ground voltage VSS according to this signal LAT and signal INV.

The bit-line-clamp-transistors CT transfer a voltage, which is determined by a voltage applied to the bit-line-clamp-voltage-line BLC, from the nodes COM0-COM3 to the bit lines BL0-BL3. In the present embodiment, voltages VDD (=2.2 V), 1.0 V, 0.5 V, and 0 V are respectively transferred to the bit lines BL0, BL1, BL2, and BL3. The bit lines BL0-BL3, which correspond to the memory cells MC1-0 through MC1-3 subject to execution of the write operation, are thus applied with a voltage that differs according to information to be written. Here, the voltage is applied to the bit lines BL0-BL3 such that the greater a voltage value of the threshold voltage distribution of information to be written to the memory cells MC1-0 through MC1-3, the smaller the voltage applied to the bit lines BL0-BL3 is set.

Figure 9:
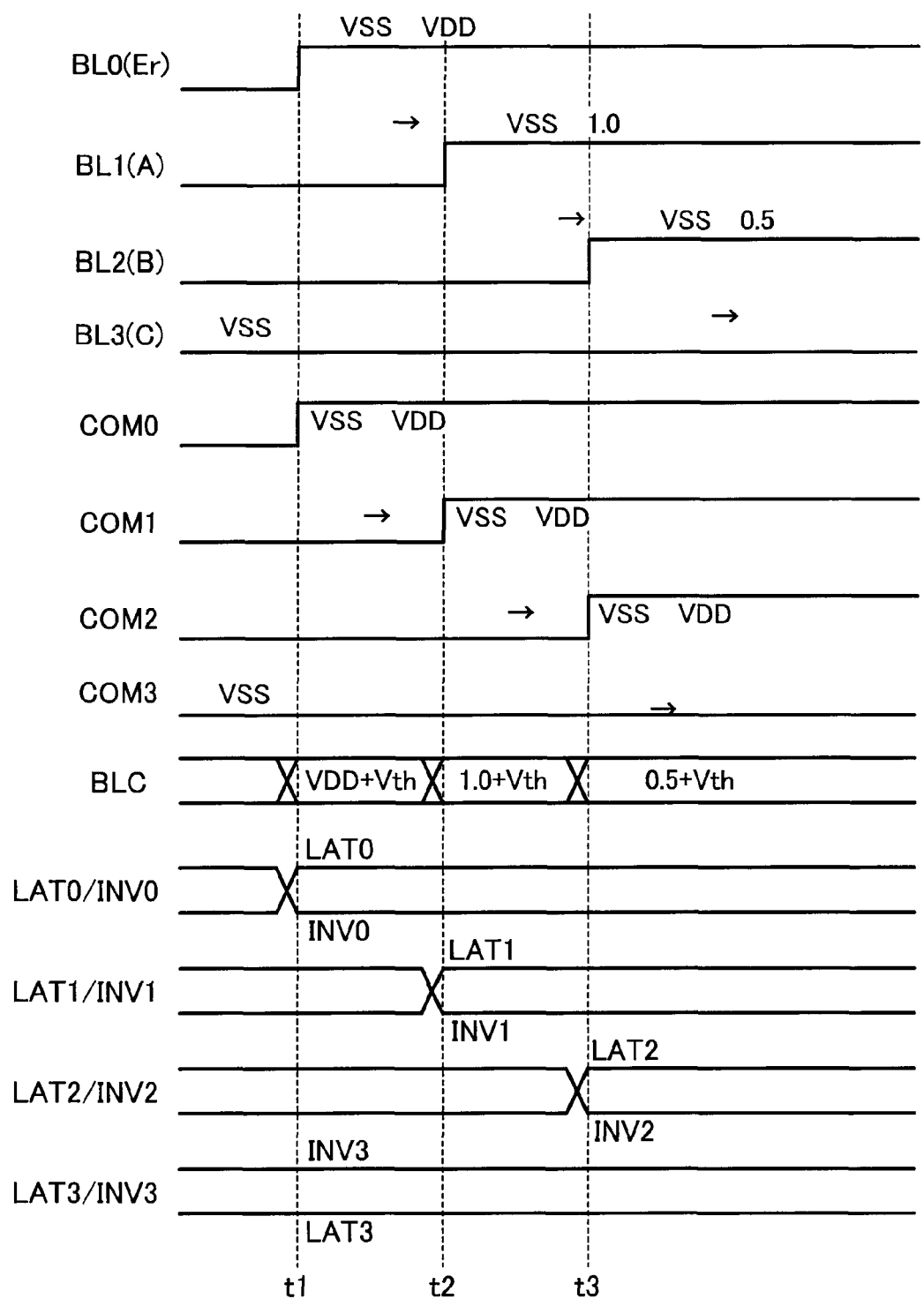
FIG. 9 is a waveform chart describing voltage application operations on a bit line in the nonvolatile semiconductor memory device in accordance with the first embodiment.

Control of the voltage transferred to the bit lines BL0-BL3 is described with reference to FIG. 9. FIG. 9 is a waveform chart describing voltage application operations on the bit lines BL0-BL3 in the nonvolatile semiconductor memory device in accordance with the present embodiment. Prior to commencement of voltage application operations on the bit lines BL0-BL3, the bit lines BL0-BL3 and the nodes COM0-COM3 connected to the bit lines BL0-BL3 are each set to the ground voltage VSS.

At time t1, the signals LAT0 and INV0 applied to the sense amplifier SA0 are set to "H" and "L", respectively, whereby the voltage of the node COM0 rises from the ground voltage VSS to the power supply voltage VDD. In addition, the voltage applied to the bit-line-clamp-voltage-line BLC rises to a voltage VDD+Vth. The voltage Vth is a threshold voltage at which the bit-line-clamp-transistor CT is conductive. The voltage VDD applied to the node COM0 is transferred to the bit line BL0 via the bit-line-clamp-transistor CT.

At time t2, the signals LAT1 and INV1 applied to the sense amplifier SA1 are set to "H" and "L", respectively, whereby the voltage of the node COM1 rises from the ground voltage VSS to the power supply voltage VDD. In addition, the voltage applied to the bit-line-clamp-voltage-line BLC falls to a voltage 1.0 V+Vth. The bit line BL1 is applied with a voltage 1.0 V which may be transferred by the bit-line-clamp-transistor CT that is applied with the voltage VDD at the node COM1. At this time, the voltage of the bit line BL0 is VDD, and since the voltage of the bit-line-clamp-voltage-line BLC is 1.0 V+Vth, the bit-line-clamp-transistor CT connected to the bit line BL0 is cut off, whereby the bit line BL0 maintains the voltage VDD. Moreover, the bit lines BL2 and BL3 remain at the ground voltage VSS.

At time t3, the signals LAT2 and INV2 applied to the sense amplifier SA2 are set to "H" and "L", respectively, whereby the voltage of the node COM2 rises from the ground voltage VSS to the power supply voltage VDD. In addition, the voltage applied to the bit-line-clamp-voltage-line BLC falls to a voltage 0.5 V+Vth. The bit line BL2 is applied with a voltage 0.5 V which may be transferred by the bit-line-clamp-transistor CT that is applied with the voltage VDD at the node COM2. At this time, the voltage of the bit line BL0 is VDD, and since the voltage of the bit-line-clamp-voltage-line BLC is 0.5 V+Vth, the bit-line-clamp-transistor CT connected to the bit line BL0 is cut off, whereby the bit line BL0 maintains the voltage VDD. In addition, the voltage of the bit line BL1 is 1.0 V, and since the voltage of the bit-line-clamp-voltage-line BLC is 0.5 V+Vth, the bit-line-clamp-transistor CT connected to the bit line BL1 is cut off, whereby the bit line BL1 maintains the voltage 1.0 V. Moreover, the bit line BL3 remains at the ground voltage VSS.

By lowering the voltage value of the bit-line-clamp-voltage-line BLC in a number of steps corresponding to a number of bits stored by one of the memory cells MC in this way, the bit lines BL0, BL1, BL2, and BL3 are respectively applied with the voltages VDD, 1.0V, 0.5V, and 0 V. Subsequently, the program voltage Vpgm applied to the word line WL1 of the write page is raised in increments of 0.1-1 V from an initial value Vpgmi (for example, about 15 V), thereby raising the threshold voltage of the memory cells MC in a stepwise manner. The write operation (application of the program voltage Vpgm) is completed when write to the memory cell MC1-3 having the highest threshold voltage distribution is completed.

[Advantages]

Figure 10:
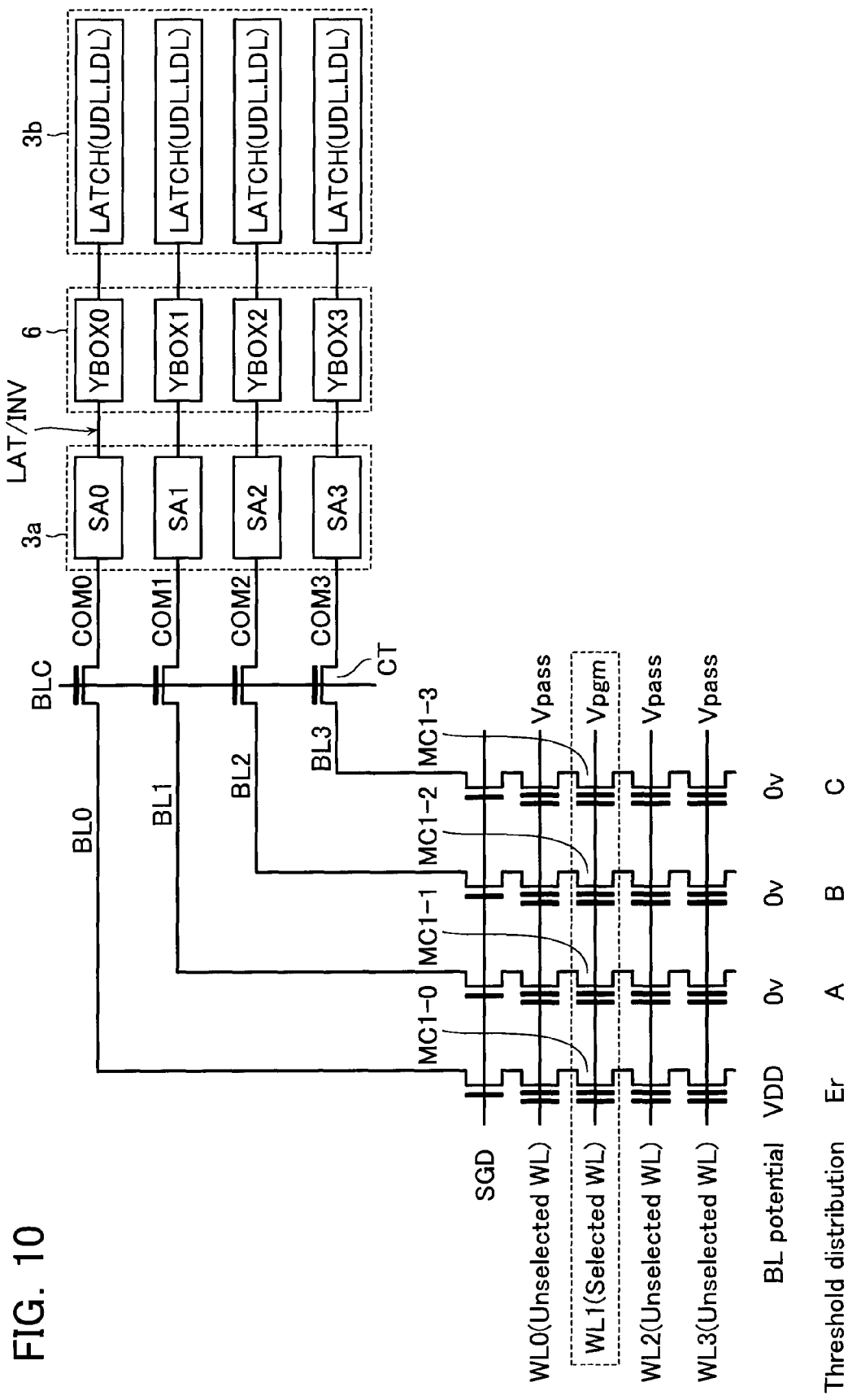
FIG. 10 is a block diagram showing a configuration of a sense amplifier circuit, an arithmetic circuit, and a data latch circuit in a nonvolatile semiconductor memory device of a comparative example.

Advantages of the write operation of information to the memory cells in the nonvolatile semiconductor memory device of the present embodiment are described with reference to a comparative example. FIG. 10 is a block diagram showing a configuration of a sense amplifier circuit, an arithmetic circuit, and a data latch circuit used in a write operation in a nonvolatile semiconductor memory device of the comparative example. Since the configuration of the sense amplifier circuit, arithmetic circuit, and data latch circuit in the nonvolatile semiconductor memory device of the comparative example is similar to the configuration of the sense amplifier circuit, arithmetic circuit, and data latch circuit in the embodiment of the present invention, the former are assigned with identical symbols to the latter and descriptions thereof are omitted.

During execution of the write operation in the nonvolatile semiconductor memory device of the comparative example, the bit line BL0 is applied with the voltage VDD. In addition, the bit lines BL1, BL2, and BL3 are applied with the voltage 0 V.

Figure 11:
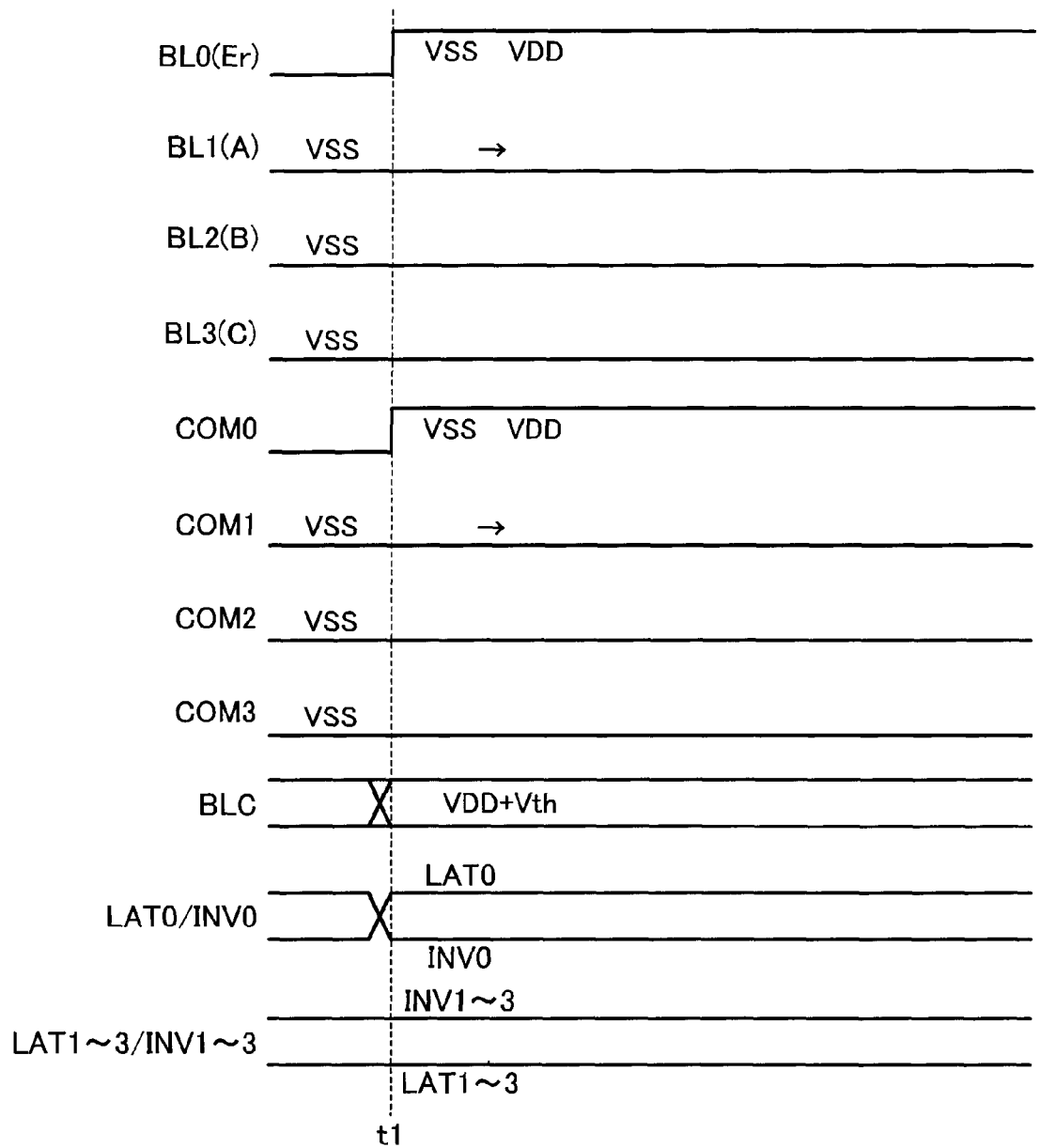
FIG. 11 is a waveform chart describing voltage application operations on a bit line in the nonvolatile semiconductor memory device of the comparative example.

Control of the voltage applied to the bit lines BL0-BL3 in the nonvolatile semiconductor memory device of the comparative example is described with reference to FIG. 11. FIG. 11 is a waveform chart describing voltage application operations on the bit lines BL0-BL3 in the nonvolatile semiconductor memory device of the comparative example. Prior to commencement of voltage application operations on the bit lines BL, the bit lines BL0-BL3 and the nodes COM0-COM3 connected to the bit lines BL0-BL3 are each set to the ground voltage VSS.

At time t1, the signals LAT0 and INV0 applied to the sense amplifier SA0 are set to "H" and "L", respectively, whereby the voltage of the node COM0 rises from the ground voltage VSS to the power supply voltage VDD. In addition, the voltage applied to the bit-line-clamp-voltage-line BLC rises to the voltage VDD+Vth. The voltage Vth is the threshold voltage at which the bit-line-clamp-transistor CT is conductive. The voltage VDD applied to the node COM0 is transferred to the bit line BL0 via the bit-line-clamp-transistor CT. In contrast, the bit lines BL1-BL3 remain at the ground voltage VSS.

In this way, the bit line BL0 is applied with the voltage VDD and the bit lines BL1-BL3 are applied with the voltage 0 V. Subsequently, the program voltage Vpgm applied to the word line WL1 of the write page is raised in increments of 0.1-1 V from the initial value Vpgmi (for example, about 15 V), thereby raising the threshold of the memory cells MC in a stepwise manner. The write operation (application of the program voltage Vpgm) is completed when write to the memory cell MC1-3 having the highest threshold voltage distribution is completed.

In the comparative example shown in FIG. 10, the memory cells MC1-1 through MC1-3 subject to execution of the data write share both the program voltage Vpgm applied to the common word line WL1 and the voltage 0 V of the bit lines BL. As a result, the degree of shift in the threshold voltage with one pulse application is the same for the memory cell intended to be written with data of the threshold voltage distribution A and the memory cell intended to be written with data of the threshold voltage distribution C. This leads to the number of pulses required to complete data write for each of the threshold voltage distributions to be, for example, 2, 5, and 10 for the threshold voltage distributions A, B, and C, respectively. The memory cell to be written with data of the threshold voltage distribution A can be written with a small number of pulses, but the memory cell to be written with data of the threshold voltage distribution C requires ten or more pulses for the write. Consequently, the time required for the write operation is increased.

In contrast, in the nonvolatile semiconductor memory device of the present embodiment shown in FIG. 8, the common word line WL1 is applied with the program voltage Vpgm, and the bit lines BL0, BL1, BL2, and BL3 are respectively applied with the voltages VDD, 1.0 V, 0.5 V, and 0 V. The amount of charge injected to the floating gate of the memory cell MC changes according to the difference between the program voltage Vpgm applied to the word line WL1 and the bit line voltage. A memory cell having its bit line applied with a low voltage is injected with a greater charge, thereby increasing the degree of change in threshold voltage for each single write operation. As a result, in the nonvolatile semiconductor memory device of the present embodiment, the degree of shift in the threshold voltage with one pulse application differs between the memory cell MC1-1 to be written with data of the threshold voltage distribution A and the memory cell MC1-3 to be written with data of the threshold voltage distribution C.

When the degree of shift in the threshold voltage with each pulse application differs between the memory cell MC1-1 to be written with data of the threshold voltage distribution A and the memory cell MC1-3 to be written with data of the threshold voltage distribution C in this way, the initial value Vpgmi of the program voltage Vpgm can be set high. This is because the change in threshold voltage of the memory cell MC1-1 to be written with data of the threshold voltage distribution A is small, with the result that, even if the initial value Vpgmi of the program voltage is set to a high voltage, there is a low risk of incorrect data being written. Furthermore, setting the initial value Vpgmi of the program voltage to a high voltage allows the change in threshold voltage of the memory cell MC1-3 to be written with data of the threshold voltage distribution C to be increased. If the change in threshold voltage is large, then, even if the threshold voltage distribution of data to be written to the memory cell MC is high voltage, a smaller number of pulses are required when writing data to the memory cell, whereby the time required for the write operation can be reduced. The nonvolatile semiconductor memory device of the present embodiment allows the data write operation to the memory cells to be executed at high speed.

Second Embodiment

Next, a second embodiment of the present invention is described with reference to FIGS. 12 and 13.

The present embodiment is substantially similar to the first embodiment regarding overall configuration and so on of the nonvolatile semiconductor memory device (FIGS. 1-9). However, in the present embodiment, a procedure (method) for control of the write data inputted to the data latch circuit and the bit line voltage based on this write data differs from that of the first embodiment.

Figure 12:
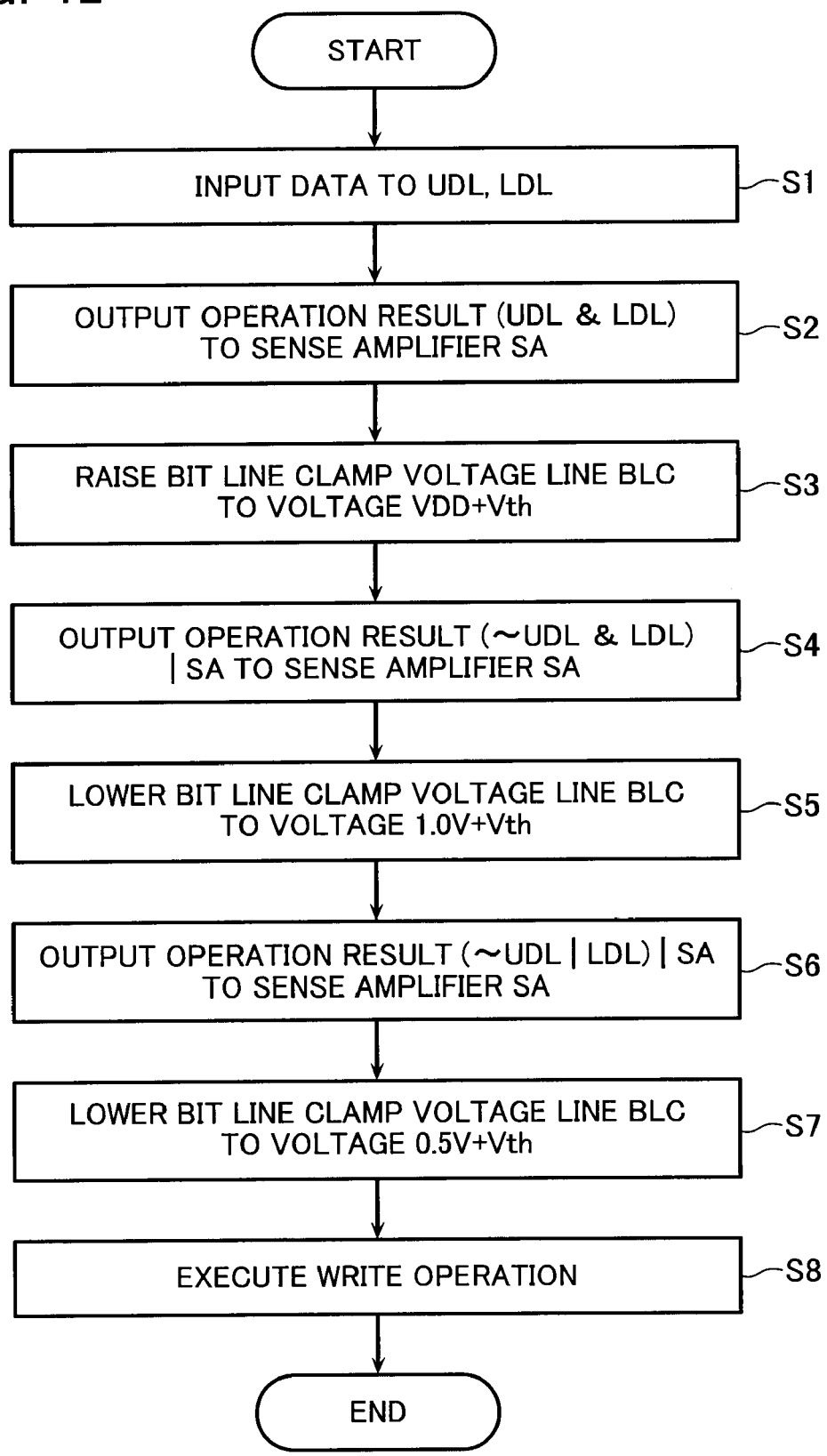
FIG. 12 is a flowchart showing a procedure for control of a bit line voltage in a nonvolatile semiconductor memory device in accordance with a second embodiment.

FIG. 12 is a flowchart showing the procedure for control of the bit line voltage in the nonvolatile semiconductor memory device in accordance with the present embodiment. FIG. 13 is a view showing a logical operation in an arithmetic circuit and data retained in a data latch circuit in the nonvolatile semiconductor memory device in accordance with the present embodiment. FIG. 13 shows the correspondence between the threshold voltage distributions Er and A-C, and data retained in the sense amplifiers SA and data latch circuits LATCH (UDL, LDL) connected to the memory cells MC to be written with data of the threshold voltage distributions Er and A-C. In addition, FIG. 13 also shows the logical operation executed in the arithmetic circuits YBOX. Here, likewise, it is assumed that the memory cell MC1-0, the memory cell MC1-1, the memory cell MC1-2, and the memory cell MC1-3 are to be respectively written with data of the threshold voltage distribution Er (data "11"), the threshold voltage distribution A (data "01"), the threshold voltage distribution B (data "00"), and the threshold voltage distribution C (data "10"). Note that since signal waveforms during the write operation of the present embodiment are identical to those shown in FIG. 9, description in the present embodiment proceeds with reference also to FIG. 9.

In step S1 of FIG. 12, upon commencement of the data write operation, the data latch circuits LATCH corresponding to the memory cells are respectively inputted with write data. The upper data latch UDL and lower data latch LDL in the data latch circuits LATCH are respectively inputted with upper page data and lower page data. A state in which data is inputted to the data latch circuits LATCH is shown in FIG. 13(a).

Next, in step S2, the arithmetic circuits YBOX0-YBOX3 perform a logical AND operation between data retained in the upper data latch UDL and data retained in the lower data latch LDL. The arithmetic circuits YBOX0-YBOX3 output this operation result to the sense amplifiers SA. The operation result outputted to the sense amplifiers SA is shown in FIG. 13(b).

Now, the arithmetic circuits YBOX0-YBOX3 output the operation result to the sense amplifiers SA0-SA3 as the signal LAT and signal INV. That is, when the operation result is 1, the signals LAT and INV are inputted to the sense amplifiers SA as "H" and "L", respectively. Further, when the operation result is 0, the signals LAT and INV are inputted to the sense amplifiers SA as "L" and "H", respectively. The sense amplifier SA0 connected to the bit line BL0 has an operation result of 1 and is thus inputted with signal LAT "H" and signal INV "L". The node COM0 corresponding to the memory cell MC1-0 to be written with data of the threshold voltage distribution Er is thereby applied with the power supply voltage VDD. The other sense amplifiers SA1-SA3 have an operation result of 0 and are thus inputted with signal LAT "L" and signal INV "H". The nodes COM1-COM3 are thereby applied with the ground voltage VSS.

In step S3, the voltage of the bit-line-clamp-voltage-line BLC connected to the gates of the bit-line-clamp-transistors CT is raised to the voltage VDD+Vth. Then, as shown at time t1 in FIG. 9, the voltage VDD applied to the node COM0 is transferred to the bit line BL0 via the bit-line-clamp-transistor CT. The other bit lines BL1-BL3 are maintained at the ground voltage VSS.

Next, in step S4, the arithmetic circuits YBOX0-YBOX3 first perform a logical AND operation between data retained in the upper data latch UDL that has been inverted and data retained in the lower data latch LDL. The arithmetic circuits YBOX0-YBOX3 then perform a logical OR operation between that operation result and data retained in the sense amplifiers SA0-SA3. The arithmetic circuits YBOX0-YBOX3 output this operation result to the sense amplifiers SA. The operation result outputted to the sense amplifiers SA is shown in FIG. 13(c).

The sense amplifiers SA0 and SA1 connected to the bit lines BL0 and BL1 have an operation result of 1 and are thus inputted with signal LAT "H" and signal INV "L". The nodes COM0 and COM1 are thereby applied with the power supply voltage VDD. The other sense amplifiers SA2 and SA3 have an operation result of 0 and are thus inputted with signal LAT "L" and signal INV "H". The nodes COM2 and COM3 are thereby applied with the ground voltage VSS.

In step S5, the voltage of the bit-line-clamp-voltage-line BLC connected to the gates of the bit-line-clamp-transistors CT is lowered to the voltage 1.0 V+Vth. Then, as shown at time t2 in FIG. 9, the bit line BL0 is maintained at the power supply voltage VDD, and the bit line BL1 is applied with the voltage 1.0 V which is transferred by the bit-line-clamp-transistor CT that is applied with the voltage VDD to the node COM1. The other bit lines BL2 and BL3 are maintained at the ground voltage VSS.

Next, in step S6, the arithmetic circuits YBOX0-YBOX3 first perform a logical OR operation between data retained in the upper data latch UDL that has been inverted and data retained in the lower data latch LDL. The arithmetic circuits YBOX0-YBOX3 then perform a logical OR operation between that operation result and data retained in the sense amplifiers SA0-SA3. The arithmetic circuits YBOX0-YBOX3 output this operation result to the sense amplifiers SA. The operation result outputted to the sense amplifiers SA is shown in FIG. 13(d).

The sense amplifiers SA0-SA2 connected to the bit lines BL0-BL2 have an operation result of 1 and are thus inputted with signal LAT "H" and signal INV "L". The nodes COM0-COM2 are thereby applied with the power supply voltage VDD. The other sense amplifier SA3 has an operation result of 0 and is thus inputted with signal LAT "L" and signal INV "H". The node COM3 is thereby applied with the ground voltage VSS.

In step S7, the voltage of the bit-line-clamp-voltage-line BLC connected to the gates of the bit-line-clamp-transistors CT is lowered to the voltage 0.5 V+Vth. Then, as shown at time t3 in FIG. 9, the bit lines BL0 and BL1 are respectively maintained at the power supply voltage VDD and the voltage 1.0 V, and the bit line BL2 is applied with the voltage 0.5 V which is transferred by the bit-line-clamp-transistor CT that is applied with the voltage VDD to the node COM2. The bit line BL3 is maintained at the ground voltage VSS. In this way, the voltages applied to the bit lines BL0-BL3 are controlled based on the operation result of the arithmetic circuits YBOX0-YBOX3.

Next, in step S8, the program voltage Vpgm applied to the word line WL1 of the write page is raised in increments of 0.1-1 V from the initial value Vpgmi (for example, about 15 V), thereby raising the threshold voltage of the memory cells MC in a stepwise manner. The write operation is completed when write to the memory cell MC1-3 having the highest threshold voltage distribution is completed.

[Advantages]

The method of controlling the bit line voltage in the nonvolatile semiconductor memory device in accordance with the present embodiment allows the bit lines BL0, BL1, BL2, and BL3 to be respectively applied with the voltages VDD, 1.0 V, 0.5 V, and 0 V, based on write data retained in the data latch circuits LATCH.

As mentioned above, if the voltage applied to the bit lines differs, the degree of shift in the threshold voltage with one pulse application differs between the memory cell MC1-1 to be written with data of the threshold voltage distribution A and the memory cell MC1-3 to be written with data of the threshold voltage distribution C. When the degree of shift in the threshold voltage with each pulse application differs between memory cells to be written with different data in this way, the initial value Vpgmi of the program voltage Vpgm can be set high. Setting the initial value Vpgmi of the program voltage Vpgm to a high voltage allows the change in threshold voltage of the memory cell MC1-3 to be written with data of the threshold voltage distribution C to be increased, and data to be written to the memory cells MC with a small number of pulses. The nonvolatile semiconductor memory device of the present embodiment allows the data write operation to the memory cells to be executed at high speed.

[Others]

This concludes description of embodiments of the nonvolatile semiconductor memory device in accordance with the present invention, but it should be noted that the present invention is not limited to the above-described embodiments, and that various alterations, additions, and so on, are possible within a range not departing from the scope and spirit of the invention. For example, although the above embodiments are described in the context of 2 bits of data being stored in one memory cell MC for the purpose of illustration, the present invention is not so limited and may equally be applicable to a case where multiple bits of data (such as 8-value or 16-value data) are stored in one memory cell MC. Moreover, although the embodiments are described assuming the memory cells of the nonvolatile semiconductor memory device to have a floating gate structure, the memory cells may also have a MONOS structure or the like.

What is claimed is:

1. A nonvolatile semiconductor memory device comprising:
a memory cell array having a plurality of memory cells arranged therein, each of the memory cells capable of storing multiple bits of information including multiple pages of information and is allocated to a plurality of threshold voltage distributions; and
a control circuit configured to write information to a memory cell by applying a voltage to a bit line and a word line to change a threshold voltage of the memory cell,
during writing of information to a plurality of the memory cells connected to an identical word line, the control circuit being configured to apply, to each of the bit lines corresponding to the plurality of the memory cells, any one of voltages that differ from one another according to the multiple bits of information to be written.

2. The nonvolatile semiconductor memory device according to claim 1,
wherein the control circuit comprises a bit-line-clamp-transistor having one end connected to the bit line to clamp a voltage of the bit line when a clamp voltage is applied to a gate thereof, and
wherein the control circuit lowers a value of the clamp voltage from a first value to a second value in a number of steps corresponding to a number of bits stored by one of the memory cells.

3. The nonvolatile semiconductor memory device according to claim 1,
wherein the control circuit applies the voltages to the bit line such that the greater a voltage value of the threshold voltage distribution of information to be written to the memory cells, the smaller the voltage applied to the bit line is set.

4. The nonvolatile semiconductor memory device according to claim 1,
wherein the control circuit further comprises:
a data latch circuit configured to retain data of one page out of the multiple pages as information to be written to the memory cells; and
an arithmetic circuit configured to perform a logical operation on the multiple pages of information retained in the data latch circuit, and
wherein the control circuit applies a different voltage to the bit line based on an operation result of the arithmetic circuit.

5. The nonvolatile semiconductor memory device according to claim 1,
wherein the memory cell array is configured by an arrangement of NAND cell units, each of the NAND cell units having a plurality of the memory cells connected in series.

6. The nonvolatile semiconductor memory device according to claim 1,
wherein the control circuit, when applying any one of the voltages to the bit line, applies the voltages sequentially from a voltage with a high voltage value.

7. The nonvolatile semiconductor memory device according to claim 1,
wherein the control circuit writes information to the memory cells by applying a write voltage to the word line multiple times.

8. The nonvolatile semiconductor memory device according to claim 7,
wherein the control circuit performs a write operation by stepping up a voltage value of the write voltage applied to the word line.

9. A nonvolatile semiconductor memory device comprising:
a memory cell array having a plurality of memory cells arranged therein, each of the memory cells capable of storing multiple bits of information including multiple pages of information and is allocated to a plurality of threshold voltage distributions; and
a control circuit configured to write information to a memory cell by applying a voltage to a bit line and a word line to change a threshold voltage of the memory cell,
the control circuit comprising:
a data latch circuit configured to retain data of one page out of the multiple pages as information to be written to the memory cells;
an arithmetic circuit configured to perform a logical operation on the multiple pages of information retained in the data latch circuit;
a sense amplifier circuit configured to control a voltage of a first node based on an operation result of the arithmetic circuit; and
a bit-line-clamp-transistor having one end connected to the bit line and another end connected to the first node and configured to clamp a voltage of the bit line when a clamp voltage is applied to a gate thereof,
during writing of information to a plurality of the memory cells connected to an identical word line, the control circuit being configured to apply a voltage to the first node using the sense amplifier circuit and change a value of the clamp voltage, thereby apply, to each of the bit lines corresponding to the plurality of the memory cells, any one of voltages that differ from one another according to the multiple bits of information to be written.

10. The nonvolatile semiconductor memory device according to claim 9,
wherein the control circuit, while maintaining the voltage of the first node, lowers a value of the clamp voltage from a first value to a second value in a number of steps corresponding to a number of bits stored by one of the memory cells.

11. The nonvolatile semiconductor memory device according to claim 9,
wherein the control circuit applies the voltages to the bit line such that the greater a voltage value of the threshold voltage distribution of information to be written to the memory cells, the smaller the voltage applied to the bit line is set.

12. The nonvolatile semiconductor memory device according to claim 9,
wherein the memory cell array is configured by an arrangement of NAND cell units, each of the NAND cell units having a plurality of the memory cells connected in series.

13. The nonvolatile semiconductor memory device according to claim 9,
wherein the control circuit, when applying any one of the voltages to the bit line, applies the voltages sequentially from a voltage with a high voltage value.

14. The nonvolatile semiconductor memory device according to claim 9,
wherein the control circuit writes information to the memory cells by applying a write voltage to the word line multiple times.

15. The nonvolatile semiconductor memory device according to claim 14,
wherein the control circuit performs a write operation by stepping up a voltage value of the write voltage applied to the word line.

16. A method of operating a nonvolatile semiconductor memory device, the nonvolatile semi conductor memory device including a memory cell array having a plurality of memory cells arranged therein, each of the memory cells capable of storing multiple bits of information including multiple pages of information and is allocated to a plurality of threshold voltage distributions, and a control circuit configured to write information to a memory cell by applying a voltage to a bit line and a word line to change a threshold voltage of the memory cell, comprising:
during writing of information to a plurality of the memory cells connected to an identical word line, applying, to each of the bit lines corresponding to the plurality of the memory cells, any one of voltages that differ from one another according to the multiple bits of information to be written; and
applying a write voltage to the word line multiple times to write information to the memory cells.

17. The method of operating a nonvolatile semiconductor memory device according to claim 16,
wherein the voltages are applied to the bit lines such that the greater a voltage value of the threshold voltage distribution of information to be written to the memory cells, the smaller the voltage applied to the bit line is set.

18. The method of operating a nonvolatile semiconductor memory device according to claim 16,
wherein the control circuit further comprises:
a data latch circuit configured to retain data of one page out of the multiple pages as information to be written to the memory cells; and
an arithmetic circuit configured to perform a logical operation on the multiple pages of information retained in the data latch circuit,
and wherein
data of one page as information is inputted to the data latch circuit,
the operation is executed by the arithmetic circuit based on information of the data latch circuit, and
a different voltage is applied to the bit line based on an operation result of the arithmetic circuit.

19. The method of operating a nonvolatile semiconductor memory device according to claim 16,
wherein, when any one of the voltages are applied to the bit lines, the voltages are applied sequentially from a voltage with a high voltage value.

20. The method of operating a nonvolatile semiconductor memory device according to claim 16,
wherein a write operation is performed by stepping up a voltage value of the write voltage applied to the word line.

* * * * *